(12) United States Patent
Zhang (10) Patent No.: US 7,848,556 B2
(45) Date of Patent: Dec. 7, 2010

(54) METHOD AND APPARATUS FOR CALCULATING A VIRTUAL IMAGE PLANE FOR MAGNETIC RESONANCE IMAGING

(75) Inventor: Li Zhang, Skillman, NJ (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 1098 days.

(21) Appl. No.: 11/538,845

(22) Filed: Oct. 5, 2006

(65) Prior Publication Data

US 2007/0104356 A1 May 10, 2007

Related U.S. Application Data

(60) Provisional application No. 60/724,533, filed on Oct. 7, 2005.

(51) Int. Cl.
*G06K 9/00* (2006.01)
(52) U.S. Cl. ................................ 382/131; 382/128
(58) Field of Classification Search ............. 382/131, 382/128
See application file for complete search history.

(56) References Cited

U.S. PATENT DOCUMENTS

| | | |
|---|---|---|
| 5,782,762 A | 7/1998 | Vining |
| 6,542,249 B1 * | 4/2003 | Kofman et al. ............... 356/601 |
| 6,954,202 B2 | 10/2005 | Han et al. |
| 7,088,848 B2 | 8/2006 | Faber |
| 2001/0044576 A1 | 11/2001 | Vining |
| 2002/0130820 A1 | 9/2002 | Sullivan |
| 2004/0013294 A1 * | 1/2004 | De Man et al. ............. 382/132 |
| 2004/0131140 A1 * | 7/2004 | Bruder et al. ................. 378/4 |
| 2005/0074152 A1 * | 4/2005 | Lewin et al. ................ 382/128 |
| 2005/0213850 A1 | 9/2005 | Zhang et al. |
| 2006/0052686 A1 | 3/2006 | Zhang et al. |
| 2006/0133562 A1 * | 6/2006 | Heuscher et al. ................. 378/4 |

* cited by examiner

*Primary Examiner*—Bhavesh M Mehta
*Assistant Examiner*—Nirav G Patel (57) ABSTRACT

A method and apparatus is disclosed for creating a single plane of reference, also referred to herein as a virtual image plane, as a function of image planes of individual segments of a reconstructed MRI image. In particular, in accordance with an embodiment of the present invention, such a virtual image plane is calculated by constraining the distance of all points in a reconstructed volume from a virtual image plane to be within a specific tolerance. More specifically, in accordance with another embodiment, a virtual image plane is calculated by minimizing the maximum distance of the plane from points in the composed volume, such as those points that are on the image planes of the individual segments. Calculating such a virtual image plane in this manner is advantageous in that it provides a single reference plane that is useful, for example, in making measurements associated with surgical procedures.

21 Claims, 8 Drawing Sheets

STEP 1) For $\theta_i = \theta_m$; $\theta_i \leq \theta_M$; $\theta_i = \theta_i + STEP_{big}$     a. Determine line $L(\theta_i)$ with fixed tilt angle $\theta_i$, line $L(\theta_i)$ minimizes the maximum distance from point $(x_1, y_1), (x_2, y_2), ..., (x_{n+1}, y_{n+1})$. See FIG 8.
    b. $d(\theta_i)$ = maximum distance from $(x_1, y_1), (x_2, y_2), ..., (x_{n+1}, y_{n+1})$ to $L(\theta_i)$
    c. keep tracking all local minima $d(\theta_i, z_{min})$, $z_{min} = 1, 2, ...$ End of For Loop — 701

STEP 2) For each local minimum $d(\theta_1, z_{min})$

For $\theta_{ii} = \theta_i - STEP_{big}$; $\theta_{ii} < \theta_i + STEP_{big}$; $\theta_{ii} = \theta_{ii} + STEP_{small}$
    a. Determine line $L(\theta_{ii})$ with fixed tilt angle $\theta_{ii}$, line $L(\theta_{ii})$ minimizes the maximum distance from point $(x_1, y_1), (x_2, y_2), ..., (x_{n+1}, y_{n+1})$. See FIG 8.
    b. $d(\theta_{ii})$ = maximum distance from $(x_1, y_1), (x_2, y_2), ..., (x_{n+1}, y_{n+1})$ to line $L(\theta_{ii})$
    c. find $d_{min}(\theta_i, z_{min}) = \arg\min_{ii}\{d(\theta_{ii})\}$ End of For Loop — 702

STEP 3) For $\theta_v = \arg\min_{z_{min}}\{d_{min}(\theta_i, z_{min})\}$ — 703

FIG. 7

STEP 1) For each point in $(x_1, y_1), (x_2, y_2), ..., (x_{n+1}, y_{n+1})$
    a. Calculate $b_j$ = intercept of the line with tilt angle $\theta$ and passing through point $(x_j, y_j)$
    b. Calculate $b_m = \arg\min_j\{b_j\}$; $b_M = \arg\max_j\{b_j\}$ End of For Loop — 801

STEP 2) Calculate $b = 1/2\{b_m + b_M\}$ to determine line $L(\theta)$: $y = \tan(\theta) \cdot x + b$ that minimizes the maximum distance with a fixed tilt angle $\theta$. — 802

METHOD AND APPARATUS FOR CALCULATING A VIRTUAL IMAGE PLANE FOR MAGNETIC RESONANCE IMAGING

This patent application claims the benefit of U.S. Provisional Application No. 60/724,533, filed Oct. 7, 2005, which is hereby incorporated by reference herein in its entirety.

BACKGROUND OF THE INVENTION

The present invention relates generally to magnetic resonance imaging (MRI) and, more particularly, to virtual planes used in MRI images.

Magnetic Resonance Imaging (MRI) systems have become ubiquitous. Such systems use strong magnetic fields and radio waves to produce clear and detailed two- and three-dimensional images of anatomical parts of a body. The resolution of such MRI systems makes them particularly useful for imaging anatomical structures such as the spine in order to examine the anatomy of the vertebrae that make up the spine, as well as the spinal cord and the spaces between the vertebrae through which nerves pass.

Figure 1A:
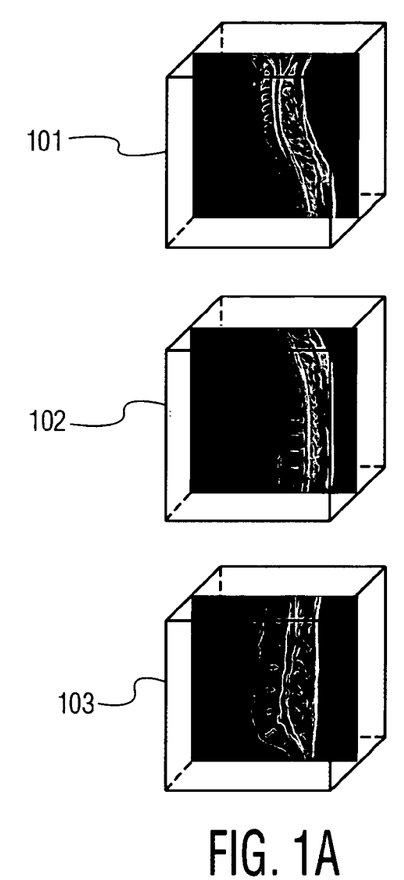
FIG. 1A shows how segmented images can be taken of an anatomical feature such as a spine.
Figure 1B:
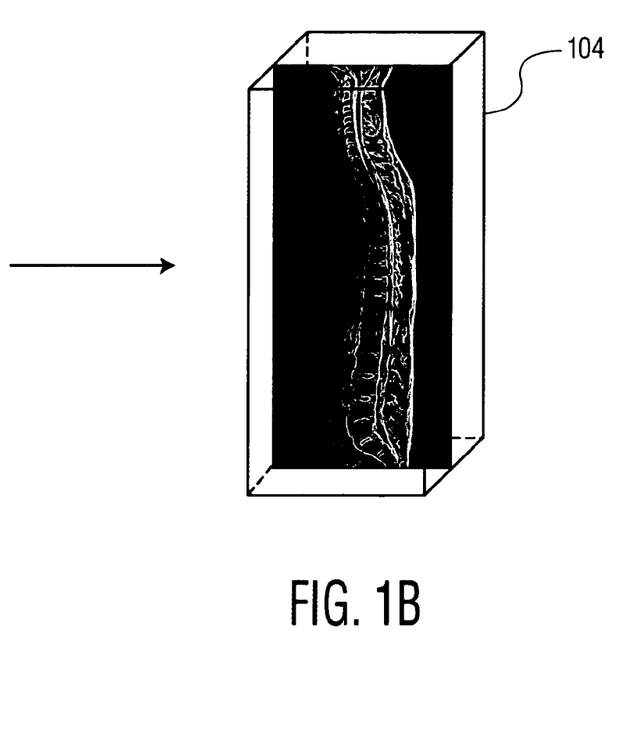
FIG. 1B shows the segmented features of FIG. 1A can be reconstructed into a reconstructed image.

However, as one skilled in the art will recognize, the field of view of typical MRI systems is limited. As a result, in many circumstances, the object to be imaged (e.g., the spine) cannot be imaged completely during one scan. As a result, different parts of the spine are imaged separately to produce a series of ordered 3D volumes associated with each of these parts of the spine. As one skilled in the art will recognize, and as used herein, a 3D volume refers to a volume formed from a number of 2D images, such as images taken by an MRI system. FIG. 1A shows one illustrative example of how different parts of a spine may be imaged in multiple stages. Referring to that figure, image 101 is an image of the cervical vertebrae of a spine, image 102 is an image of the thoracic vertebrae of the spine, and image 103 is an image of the lumbar vertebrae of the spine. Once obtained for each part of the spine, then these separate ordered volumes are composed into a single comprehensive volume, such as image 104 in FIG. 1B, using known techniques. Techniques for reconstructing segmented volumes of an anatomical feature are described in copending U.S. patent application Ser. No. 10/974,503, filed Oct. 27, 2004, titled Method and System for Focus-Adaptive Reconstruction of Spine Images; and in copending U.S. patent application Ser. No. 11/185,603, filed Jul. 20, 2005, titled Feature-Based Composing for 3D MR Angiography Images, both of which are hereby incorporated by reference herein in their entirety.

SUMMARY OF THE INVENTION

The present inventor has recognized that, while the aforementioned methods for imaging anatomical features using, for example, MRI systems, are advantageous in many regards, they are also disadvantageous in some aspects. In particular, prior attempts at such imaging methods did not produce an accurate reference plane from which to take measurements of a reconstructed ordered volume Accordingly, the present inventor has invented a method and apparatus for creating a single plane of reference, also referred to herein as a virtual image plane, as a function of image planes of individual segments of a reconstructed MRI image. In particular, in accordance with an embodiment of the present invention, such a virtual image plane is calculated by constraining the distance of all points in a reconstructed volume from a virtual image plane to be within a specific tolerance. More specifically, in accordance with another embodiment, a virtual image plane is calculated by minimizing the maximum distance of the plane from points in the composed volume, such as those points that are on the image planes of the individual segments. Calculating such a virtual image plane in this manner is advantageous in that it provides a single reference plane that is useful, for example, in making measurements associated with surgical procedures.

These and other advantages of the invention will be apparent to those of ordinary skill in the art by reference to the following detailed description and the accompanying drawings.

DETAILED DESCRIPTION

Figure 2A:
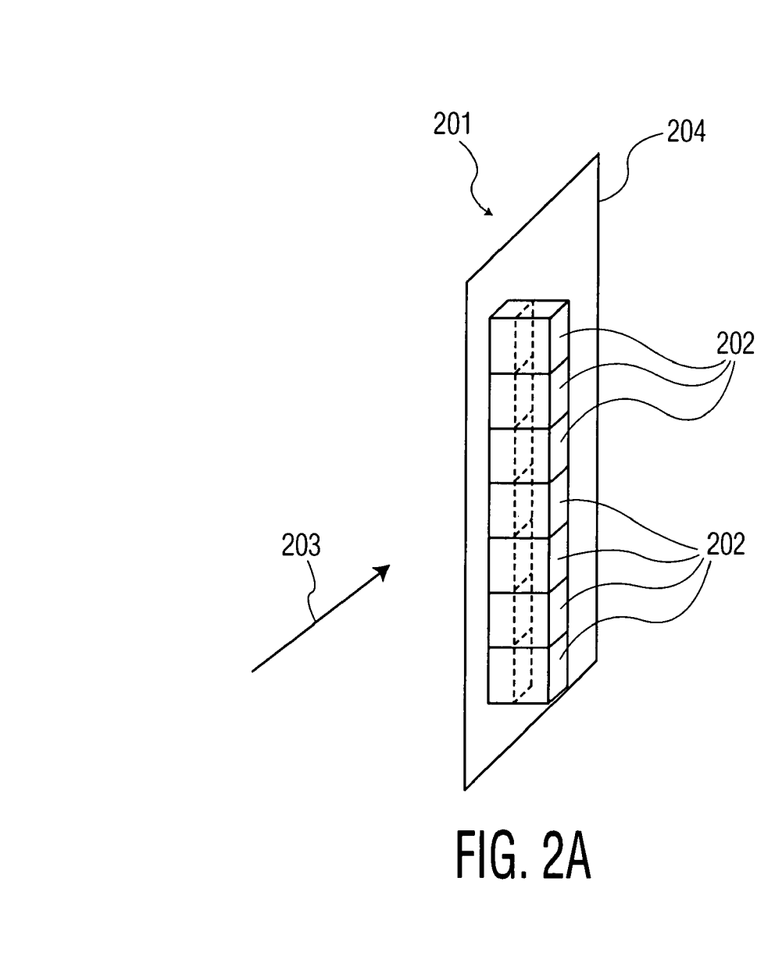
FIGS. 2A and 2B show how different image tilt angles may be used to image anatomical features.
Figure 2B:
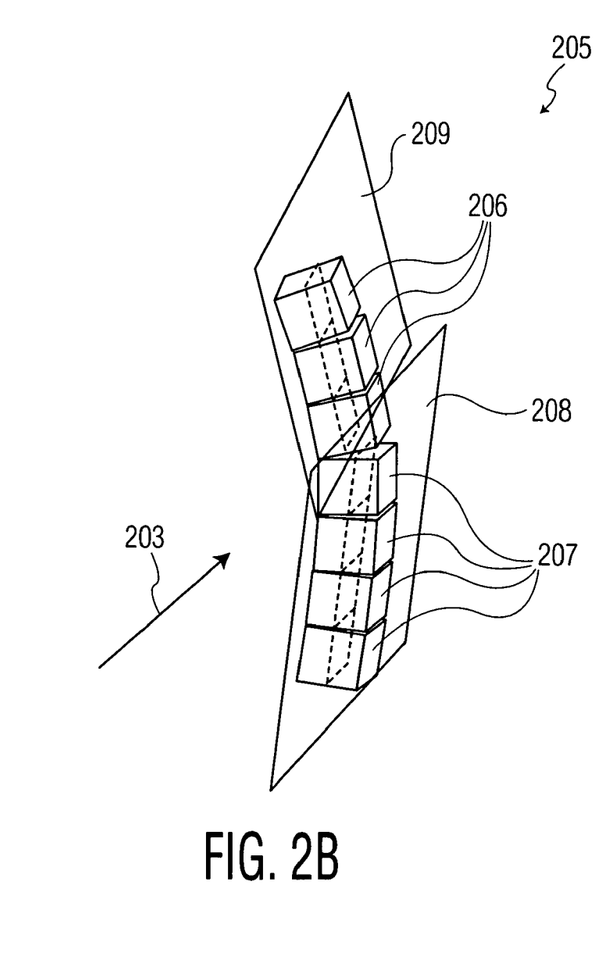

As discussed above, certain anatomical features cannot be imaged completely in one scan of, for example, an MRI machine. In such cases, when different parts of an anatomical feature are imaged separately, different image tilt angles of the imaging apparatus of the MRI machine are commonly used in order to optimize the visualization of anatomical structures. For example, FIG. 2A shows an illustrative block diagram 201 of a spine whereby blocks 202 represent the vertebrae of a spine that is straight when viewed in direction 203 which is, for example, the view directly behind a patient. In this case, plane 204 represents the imaging plane that can be used for all image segments to obtain a reconstructed image of the spine. On the other hand, FIG. 2B shows another illustrative block diagram 205 of a spine whereby blocks 206 represent the vertebrae of a spine that is curved when viewed in direction 203. A view from direction 203 represents, for example, a direction perpendicular to the viewing screen upon which the diagrams of FIGS. 2A and 2B are displayed. These views may represent views of a spine from directly behind the patient As one skilled in the art will recognize, the spine of FIG. 2B may represent a scoliatic spine. In this case, since different portions of the spine lie on different identifiable axes, it may be desirable to use an image plane 209 to collect an image of vertebrae 206 and use another image plane 208 with a different tilt angle with respect to plane 209 to image vertebrae 207. This is desirable since, as one skilled in the art will also recognize, if only one image plane is used for both portions of the spine of FIG. 2B, at least one of the portions will be distorted in size and possibly geometry.

Figure 3A:
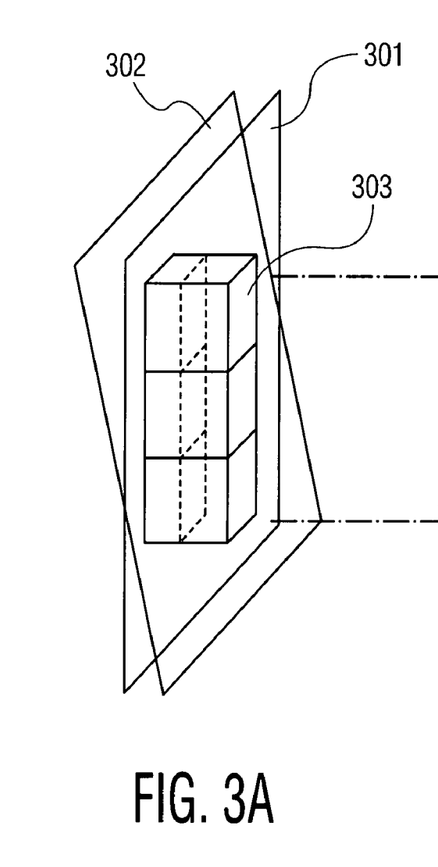
FIGS. 3A, 3B and 3C show how different image tilt angles can produce images of the same object having different proportions.
Figure 3B:
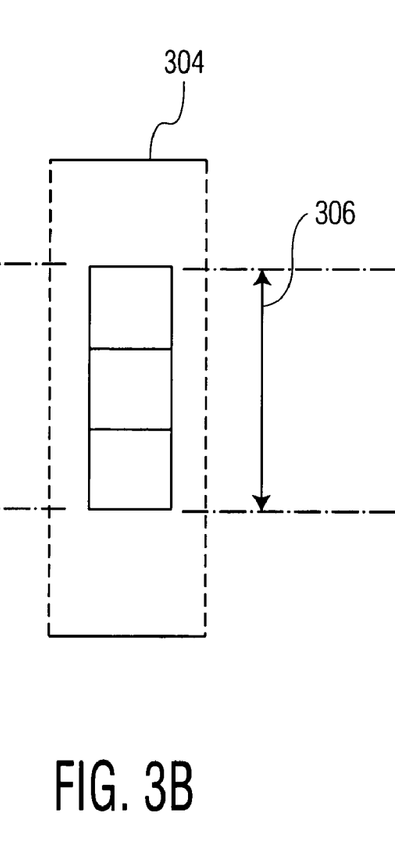
Figure 3C:
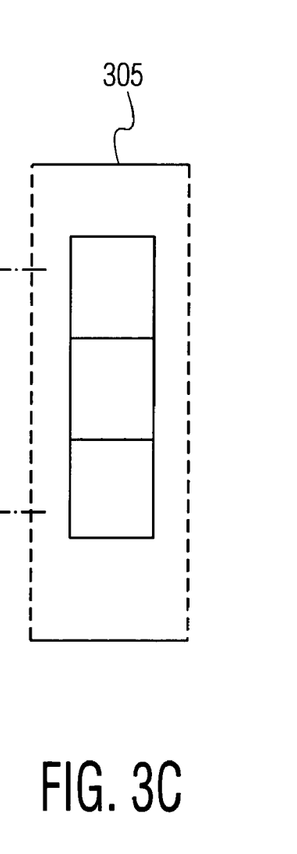

FIGS. 3A, 3B and 3C illustrate how such a distortion may be caused. Specifically, FIG. 3A shows two image planes 301 and 302, respectively, tilted at different angles with respect to the vertebrae 303 of a spine. The actual height of the three illustrative vertebrae 303 is represented by line 306. As one skilled in the art will recognize, and as is seen in FIG. 3B, image plane 301, which is along the axis of the vertebrae, produces an image 304 representing an accurate height of each of the vertebrae as well as the three vertebrae together. However, as is seen in FIG. 3C, the vertebrae of image 305 are each enlarged and, as a result, the height of the three vertebrae together is enlarged. Using different tilt angles corresponding to the axis of the section of the spine to be imaged produces a more accurate individual image for each section which, in turn, produces a more accurate combined image once the images of different segments of the spine are reconstructed.

Figure 4A:
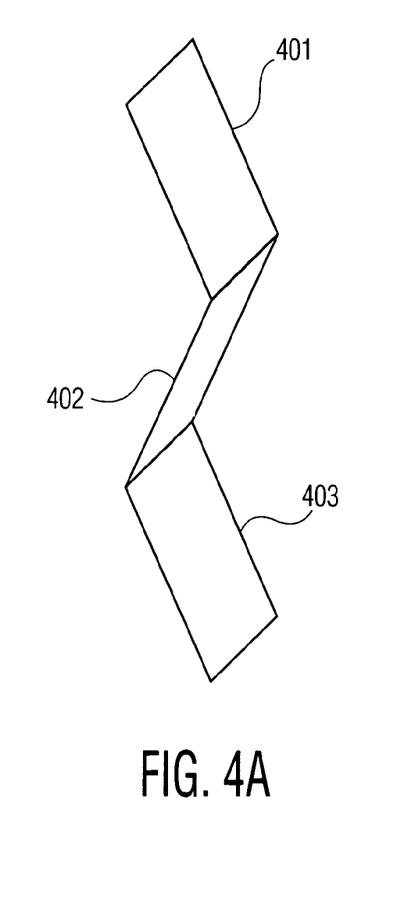
FIG. 4A shows how different image planes can be connected in forming a reconstructed image.
Figure 4B:
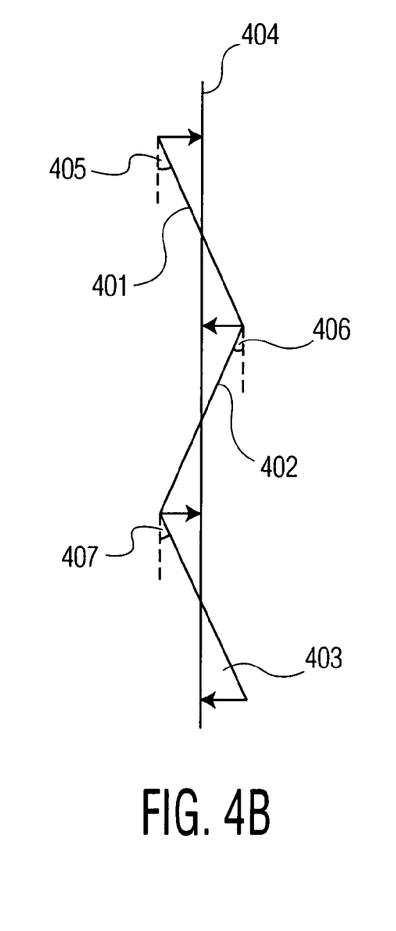
FIG. 4B shows a virtual image plane defined for the connected image planes of FIG. 4A.

However, while the use of image planes tilted at different angles for different sections of a spine produces a more accurate reconstructed image of the spine, the use of such different image planes does not provide a single reference plane from which to take measurements of the spine, for example, for use in preparing for surgery of the spine. Therefore, the present inventor has invented a method and apparatus for creating such a single plane of reference, also referred to herein as the virtual image plane. In particular, the present inventor has recognized that, in order to ensure the correctness of measurements, the deviation of all voxels in the reconstructed volume from the virtual image plane must be within a specific tolerance. More specifically, the present inventors have recognized that the virtual image plane should be calculated in order to minimize the maximum distance of the plane from the composed volume. FIG. 4A shows three-dimensional tilted image planes 401, 402 and 403 used, for example, to collect images of, illustratively, the cervical, thoracic and lumbar portions of a spine, respectively. These planes as well as their respective tilt angles 405, 406 and 407, are shown in cross section in FIG. 4B. In addition, line 404 in FIG. 4B is shown that represents an illustrative virtual image plane. Virtual image plane 404 of FIG. 4B is desirable for use as a common plane of reference from which to take measurements associated with the imaged spine. Typically, in cases where multiple images are collected using different tilt angles, the planes are tilted mainly in one dimension, and the tilt in the other dimensions can be ignored within a required accuracy. Thus, the tilt of the planes can be considered only in one dimension, i.e., either in the coronal or sagittal directions. Accordingly, a calculation of a three-dimensional image plane can be simplified in two-dimensional space for efficiency by projecting the image planes perpendicularly.

Figure 5:
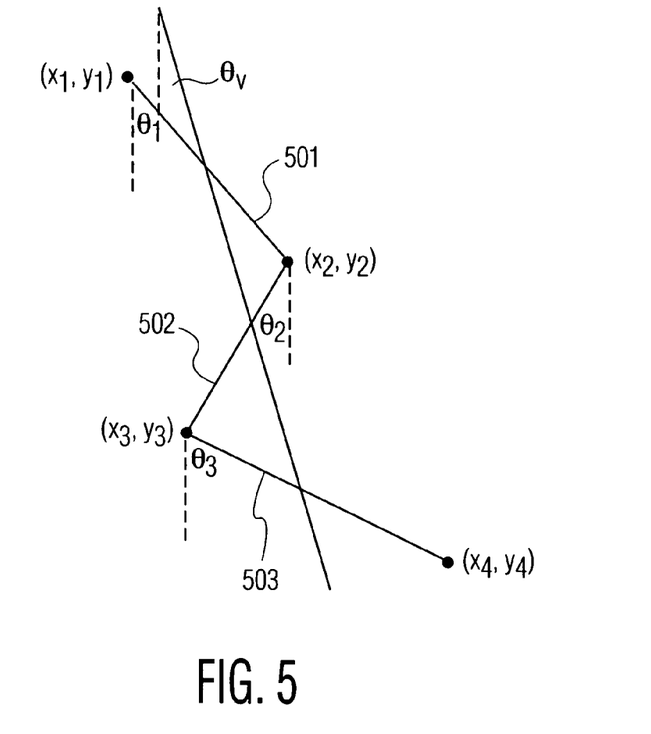
FIG. 5 shows a more specific illustrative embodiment of how connected image planes can be used to define a virtual image plane.

FIG. 5 shows another two-dimensional view of tilted image planes 501, 502 and 503 associated with image volumes of different segments of a spine. Plane 501 has tilt angle $\theta_1$, plane 502 has tilt angle $\theta_2$, and plane 503 has tilt angle $\theta_3$. As discussed above, during reconstruction of the three images of the spine, in order to produce a combined image of the spine, the individual image volumes associated with planes 501, 502 and 503 are overlapped, or registered, with each other. Here, the respective intersections of planes 501 with plane 502 and the intersection of plane 502 with plane 503 are represented in FIG. 5 in two dimensions by points $(x_2, y_2)$ and $(x_3, y_3)$, respectively. Points $(x_1, y_1)$ and $(x_4, y_4)$ represent the upper boundary of planes 501 and 503, also respectively. The position of points $(x_1, y_1)$, $(x_2, y_2)$, $(x_3, y_3)$, $(x_4, y_4)$ and the angles $\theta_1$, $\theta_2$, and $\theta_3$ may be obtained typically as a function of the process of taking multi-stage images and the reconstruction process of combining those multiple images. More particularly, multi-volume MRI images are accompanied by headers, referred to in the art as Digital Imaging and Communications in Medicine (DICOM) headers. These headers, which are well-known in the art, store information about the patient, the type of scan, the dimensions of the scan, as well as other text information about the positioning of the scan. One skilled in the art will recognize how this information, coupled with information obtained and/or generated from the alignment parameters used by the aforementioned reconstruction processes, can be used to obtain the points and angle measurements of FIG. 5.

More generically, let $(x_1, y_1)$, $(x_2, y_2)$, ..., $(x_{n+1}, y_{n+1})$ represent the point positions in two dimensions of the intersections of the image planes of n images $P_1, P_2, \ldots, P_n$, which are from n ordered volumes that have been composed/reconstructed. Similarly, let $\theta_1, \theta_2, \ldots, \theta_n$ represent the tilt angles associated with the image planes of the n images. Using these conventions, in accordance with an embodiment of the present invention, in order to find the virtual image plane $P_v$, the tilt angle $\theta_v$ of the virtual plane is first determined and, then, the image position of $P_v$ is calculated as a function of the tilt angle $\theta_v$. Specifically, in order to determine the tilt angle $\theta_v$, let $\theta_m = \min\{\theta_1, \theta_2, \ldots, \theta_n\}$, and $\theta_M = \max\{\theta_1, \theta_2, \ldots, \theta_n\}$. Then, $\theta_v$ can be determined by a search algorithm within the range of $[\theta_m, \theta_M]$.

Figure 6:
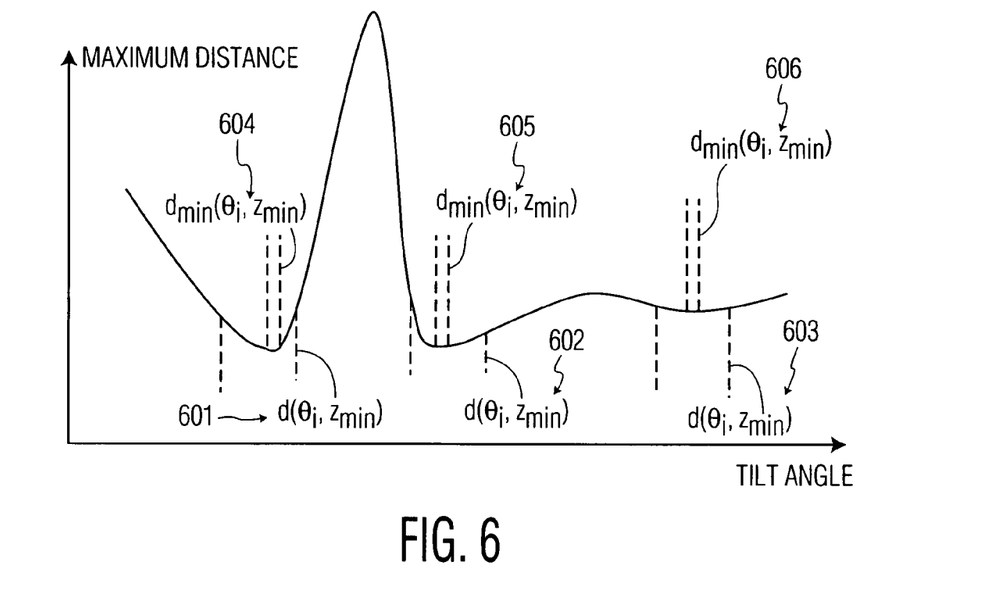
FIG. 6 shows a graph of the maximum distance between points on illustrative connected image planes and a virtual image plane as a function of the tilt angle of the virtual image plane.

One skilled in the art will recognize that, for any given virtual image plane having a particular tilt angle, there may exist multiple local minima for the maximum distance from the image planes $P_1, P_2, \ldots, P_n$ (and hence the image volumes associated with those image planes) and the virtual image plane. The graph of FIG. 6 illustrates how, in accordance with the algorithms (shown in pseudocode) of FIGS. 7 and 8, these local minima are first identified using a coarse search and, then, refined using a fine search. More particularly, referring to the algorithm of FIG. 7, at step 701, a search for local minima of the graph of FIG. 6 is initiated at $\theta_m$ (i.e., an initial potential virtual image plane tilt angle) and, using a step size of $\theta_i = \theta_i + STEP_{big}$, the coarse local minima are identified. To initiate this search, a line is first identified corresponding to $\theta_i$. One such algorithm for identifying such a line is shown in pseudocode in FIG. 8. Specifically, referring to FIG. 8, at step 801, in the 2D space shown in FIG. 5, for each point $(x_1, y_1)$, $(x_2, y_2), \ldots, (x_{n+1}, y_{n+1})$ the $L_j(\theta_i)$ represent the line with tilt angle $\theta_i$ and passing through point $(x_j, y_j)$. Then, the intercept $b_j$ of line $L_j(\theta_i)$ (the point at which the line crosses the y-axis) is determined and the values $$b_m = \operatorname*{argmin}_{j}\{b_j\}, \text{ and } b_M = \operatorname*{argmax}_{j}\{b_j\}$$

are then calculated. Once these values for $b_m$ and $b_M$ have been calculated, then at step 802, an intercept b is calculated according to the equation $$b = \frac{1}{2}\{b_m + b_M\}$$

to determine line $L(\theta_i)$ that is defined by the equation $y=\tan(\theta_i)*x+b$. Once the line $L(\theta_i)$ is calculated, referring again to step 701 in FIG. 7, $d(\theta_i)$ is calculated as the maximum distance from each point $(x_1, y_1), (x_2, y_2), \ldots, (x_{n+1}, y_{n+1})$ to line $L(\theta_i)$. Then the coarse local minima $d(\theta_i, z_{min})$ are identified where $z_{min}=1, 2\ldots$. Such coarse local mimima are shown in FIG. 6 as minima $d(\theta_i, z_{min})$ 601, 602 and 603.

Figure 7:
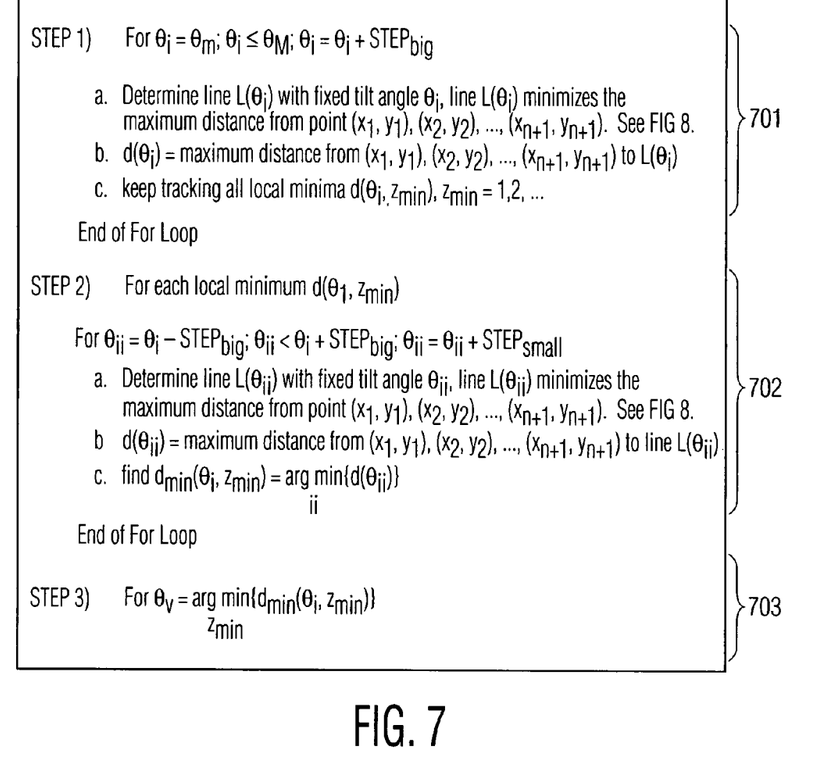
FIG. 7 shows a pseudocode algorithm in accordance with an embodiment of the present invention.
Figure 8:
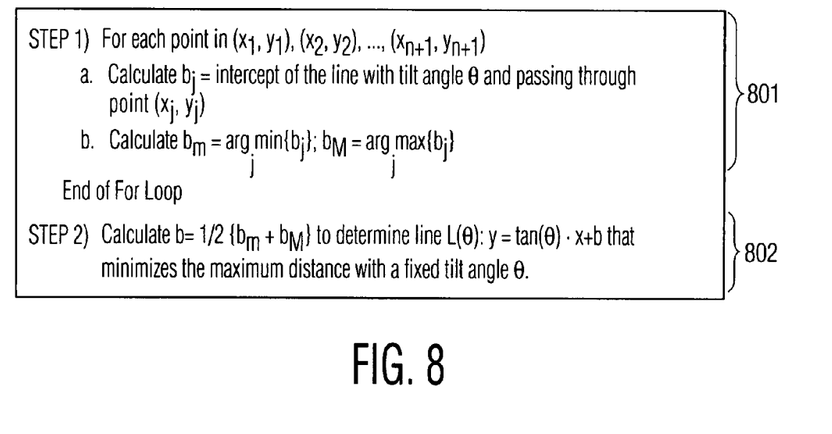
FIG. 8 shows another pseudocode algorithm in accordance with an embodiment of the present invention.

One skilled in the art will recognize that it is typically desirable to more precisely identify the angle $\theta_v$. Accordingly, in step 702 of FIG. 7, an angle $\theta_{ii}$ is identified within the range of each coarse local minima to determine a more precise virtual image plane tilt angle $\theta_v$. Referring to step 702 of FIG. 7, the algorithm of FIG. 8 is once again used as discussed above to identify more precisely for each $\theta_{ii}$ a new line $L(\theta_{ii})$ representing a potential virtual image plane in two dimensions. Then, also as discussed above, distance $d(\theta_{ii})$ is calculated as the maximum distance from each point $(x_1, y_1), (x_2, y_2), \ldots, (x_{n+1}, y_{n+1})$ to line $L(\theta_{ii})$. Next, refined local minima $$d_{min}(\theta_i, z_{min}) = \operatorname*{argmin}_{ii}\{d(\theta_{ii})\}$$

are identified. Such refined local minima are shown in FIG. 6 as minima $d_{min}(\theta_i, z_{min})$ 604, 605 and 606. Finally, the virtual image plane having tilt angle $\theta_v$ is then selected according to the expression $$\theta_v = \operatorname*{argmin}_{z_{min}}\{d_{min}(\theta_i, z_{min})\}.$$

As discussed above, this virtual image plane represents the image plane that minimizes the maximum distance of the plane from the individual planes of the composed/reconstructed volume.

Figure 9:
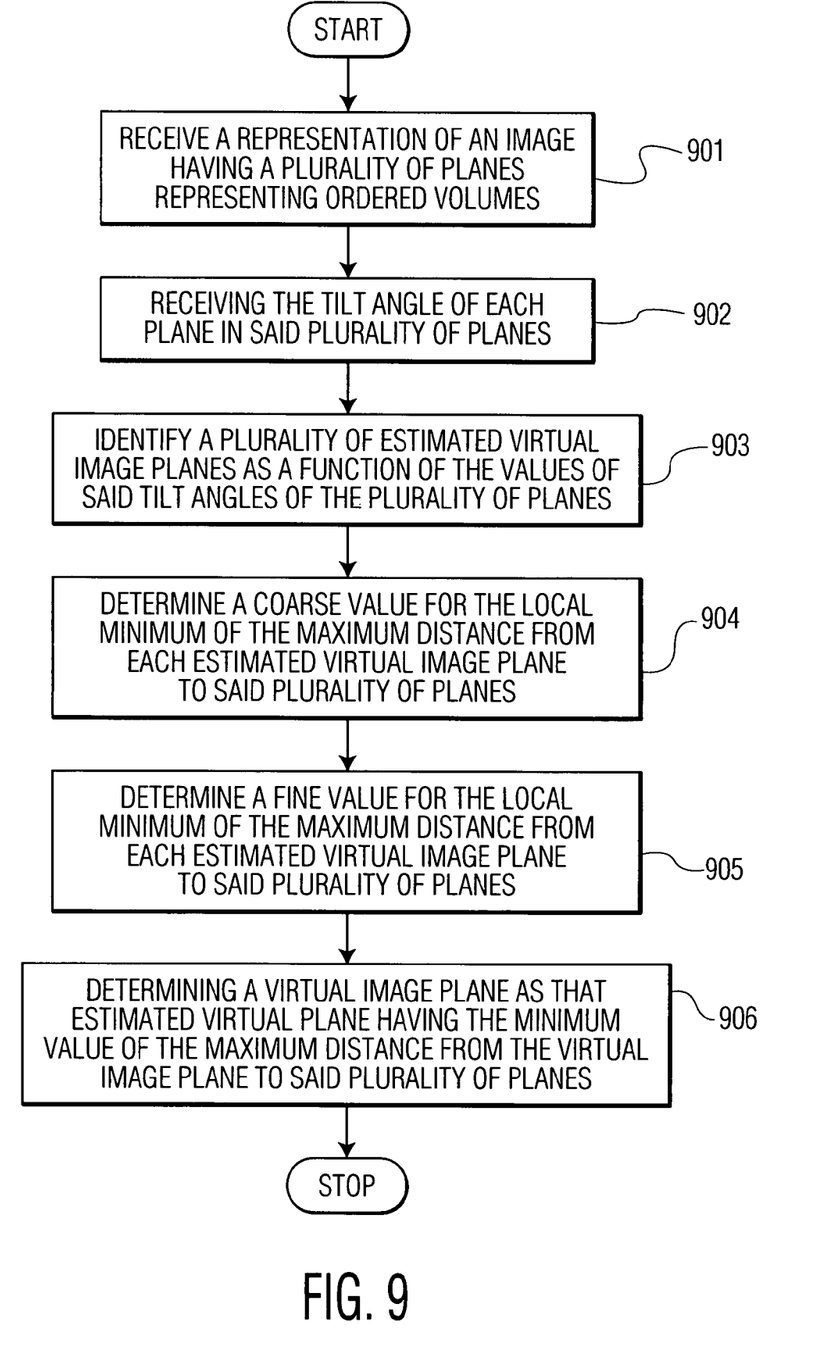
FIG. 9 is a flow chart showing the steps of a method in accordance with an embodiment of the present invention.

FIG. 9 shows the steps of a method in accordance with the embodiments described herein above. Referring to that figure, at step 901 a representation of an image having a plurality of planes representing ordered volumes is received. Then, at step 902, the tilt angle of each plane in said plurality of planes is received. As one skilled in the art will recognize, as discussed herein above, these angles can be calculated based, for example, on headers of the representation of the image. Next, at step 903, a plurality of estimated virtual image planes is determined as a function of the values of said tilt angles of the plurality of planes. At step 904, a coarse value for the local minimum of the maximum distance from each estimated virtual image plane to said plurality of planes is determined. Then, at step 905, a fine value for the local minimum of the maximum distance from each estimated virtual image plane to said plurality of planes is determined. Finally, at step 906, a virtual image plane is selected as that estimated virtual plane having the overall minimum value of the maximum distance from the virtual image plane to said plurality of planes.

Figure 10:
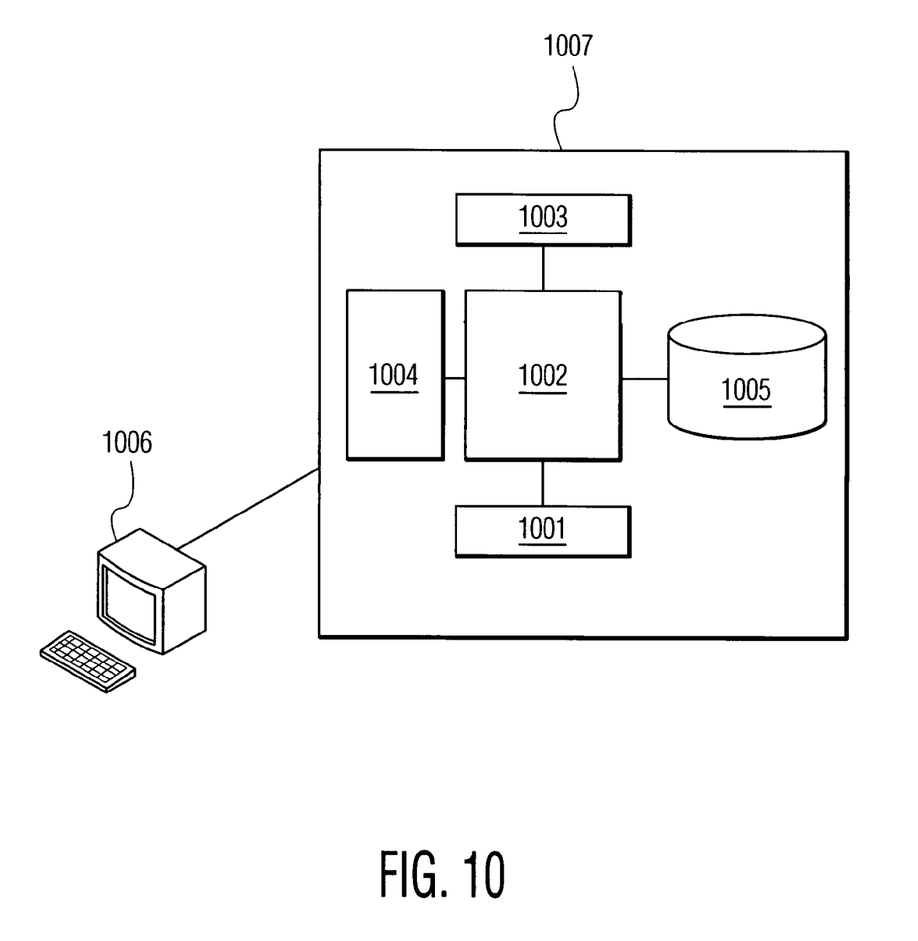
FIG. 10 shows a computer adapted to perform the illustrative steps of the method of FIG. 9 as well as other functions associated with connecting image planes and creating a virtual image plane.

The foregoing embodiments are generally described in terms of identifying and manipulating objects, such as points representing portions of an anatomical feature, such as a segment of a spine, and image planes representing images of those anatomical features. One skilled in the art will recognize that such manipulations may be, in various embodiments, virtual manipulations accomplished in the memory or other circuitry/hardware of an illustrative registration system. One skilled in the art will recognize that such manipulations may be, in various embodiments, virtual manipulations accomplished in the memory or other circuitry/hardware of an illustrative computer aided design (CAD) system. Such a CAD system may be adapted to perform these manipulations, as well as to perform various methods in accordance with the above-described embodiments, using a programmable computer running software adapted to perform such virtual manipulations and methods. An illustrative programmable computer useful for these purposes is shown in FIG. 10. Referring to that figure, a CAD system 1007 is implemented on a suitable computer adapted to receive, store and transmit data such as the aforementioned image data. Specifically, illustrative CAD system 1007 may have, for example, a processor 1002 (or multiple processors) which controls the overall operation of the CAD system 1007. Such operation is defined by computer program instructions stored in a memory 1003 and executed by processor 1002. The memory 1003 may be any type of computer readable medium, including without limitation electronic, magnetic, or optical media. Further, while one memory unit 1003 is shown in FIG. 10, it is to be understood that memory unit 1003 could comprise multiple memory units, with such memory units comprising any type of memory. CAD system 1007 also comprises illustrative modem 1001 and network interface 1004. CAD system 1007 also illustratively comprises a storage medium, such as a computer hard disk drive 1005 for storing, for example, data and computer programs adapted for use in accordance with the principles of the present invention as described hereinabove. Finally, CAD system 1007 also illustratively comprises one or more input/output devices, represented in FIG. 10 as terminal 1006, for allowing interaction with, for example, a technician or database administrator. One skilled in the art will recognize that CAD system 1007 is merely illustrative in nature and that various hardware and software components may be adapted for equally advantageous use in a computer in accordance with the principles of the present invention.

One skilled in the art will also recognize that the software stored in the computer system of FIG. 10 may be adapted to perform various tasks in accordance with the principles of the present invention. In particular, such software may be graphical software adapted to import ordered volumes/images of anatomical features, for example those images generated from MRI imaging. In addition, such software may allow for the automatic calculation of image planes and virtual image planes. The software of a computer-based system such as CAD system 1007 may also be adapted to perform other functions which will be obvious in light of the teachings herein. All such functions are intended to be contemplated by these teachings.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for identifying a virtual image plane comprising:

identifying a plurality of reconstructed image planes representing a plurality of reconstructed images, each reconstructed image plane in said plurality of reconstructed image planes having a corresponding tilt angle;

identifying a plurality of estimated image planes as a function of said tilt angles;

determining at a computer for each estimated image plane a maximum distance from a point on a reconstructed image plane in said plurality of reconstructed image planes to each estimated image plane in said plurality of estimated image planes; and identifying at the computer a virtual image plane as a function of said step of determining said maximum distance.

2. The method of claim 1 wherein said step of identifying a virtual image plane comprises identifying an estimated image plane in said plurality of estimated image planes having a minimum value of said maximum distance.

3. The method of claim 2 wherein said step of identifying a virtual image plane comprises:

performing a coarse search for said minimum value as a function of an identified range of tilt angles associated with said plurality of estimated image planes; and performing a fine search for said minimum value as a function of said coarse search.

4. The method of claim 3 wherein said identified range of tilt angles comprises a range between a minimum tilt angle and a maximum tilt angle associated with said plurality of reconstructed image planes.

5. The method of claim 4 wherein said plurality of estimated image planes are defined by the expression:

$$y=\tan(\theta_i)*x+b$$

where $\theta_i$ is the tilt angle of estimated image plane i; and b is the intercept of image plane i with a y-axis.

6. The method of claim 1 wherein each reconstructed image plane in said plurality of reconstructed image planes comprises an image plane associated with an ordered volume.

7. The method of claim 6 wherein said ordered volume comprises a plurality of images obtained from a magnetic resonance imaging process.

8. An apparatus for identifying a virtual image plane comprising:

means for identifying a plurality of reconstructed image planes representing a plurality of reconstructed images, each reconstructed image plane in said plurality of reconstructed image planes having a corresponding tilt angle;

means for identifying a plurality of estimated image planes as a function of said tilt angles;

means for determining for each estimated image plane a maximum distance from a point on a reconstructed image plane in said plurality of reconstructed image planes to each estimated image plane in said plurality of estimated image planes; and means for identifying a virtual image plane as a function of said step of determining said maximum distance.

9. The apparatus of claim 8 wherein said means for identifying a virtual image plane comprises means for identifying an estimated image plane in said plurality of estimated image planes having a minimum value of said maximum distance.

10. The apparatus of claim 9 wherein said means for identifying a virtual image plane comprises:

means for performing a coarse search for said minimum value as a function of an identified range of tilt angles associated with said plurality of estimated image planes; and means for performing a fine search for said minimum value as a function of said coarse search.

11. The apparatus of claim 10 wherein said identified range of tilt angles comprises a range between a minimum tilt angle and a maximum tilt angle associated with said plurality of reconstructed image planes.

12. The apparatus of claim 11 wherein said plurality of estimated image planes are defined by the expression:

$$y=\tan(\theta_i)*x+b$$

where $\theta_i$ is the tilt angle of each estimated image plane i; and b is the intercept of image plane i with a y-axis.

13. The apparatus of claim 8 wherein each reconstructed image plane in said plurality of reconstructed image planes comprises an image plane associated with an ordered volume.

14. The apparatus of claim 13 wherein said ordered volume comprises a plurality of images obtained from a magnetic resonance imaging process.

15. A non-transitory computer readable medium comprising computer program instructions which, when executed on a processor, define the steps of a method for identifying a virtual image plane, said steps comprising:

identifying a plurality of reconstructed image planes representing a plurality of reconstructed images, each reconstructed image plane in said plurality of reconstructed image planes having a corresponding tilt angle;

identifying a plurality of estimated image planes as a function of said tilt angles;

determining for each estimated image plane a maximum distance from a point on a reconstructed image plane in said plurality of reconstructed image planes to each estimated image plane in said plurality of estimated image planes; and identifying a virtual image plane as a function of said step of determining said maximum distance.

16. The non-transitory computer readable medium of claim 15 wherein said computer program instructions defining the step of identifying a virtual image plane comprise computer program instructions defining the step of identifying an estimated image plane in said plurality of estimated image planes having a minimum value of said maximum distance.

17. The non-transitory computer readable medium of claim 16 wherein said computer program instructions defining the step of identifying a virtual image plane comprise computer program instructions defining the steps of:

performing a coarse search for said minimum value as a function of an identified range of tilt angles associated with said plurality of estimated image planes; and performing a fine search for said minimum value as a function of said coarse search.

18. The non-transitory computer readable medium of claim 17 wherein said identified range of tilt angles comprises a range between a minimum tilt angle and a maximum tilt angle associated with said plurality of reconstructed image planes.

19. The non-transitory computer readable medium of claim 18 wherein said plurality of estimated image planes are defined by the expression:

$$y=\tan(\theta_i)*x+b$$

where $\theta_i$ is the tilt angle of estimated image plane i; and b is the intercept of image plane i with a y-axis.

20. The non-transitory computer readable medium of claim 15 wherein each reconstructed image plane in said plurality of reconstructed image planes comprises an image plane associated with an ordered volume.

21. The non-transitory computer readable medium of claim 20 wherein said ordered volume comprises a plurality of images obtained from a magnetic resonance imaging process.

* * * * *